(12) United States Patent
Nagata et al.

(10) Patent No.: US 7,113,400 B2
(45) Date of Patent: Sep. 26, 2006

(54) HOUSING STRUCTURE OF ELECTRONIC CONTROL UNIT AND MOUNTING STRUCTURE OF THE SAME

(75) Inventors: Yoshihiro Nagata, Obu (JP); Hiroshi Kondo, Toyoake (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/394,283

(22) Filed: Mar. 24, 2003

(65) Prior Publication Data

US 2003/0184973 A1    Oct. 2, 2003

(30) Foreign Application Priority Data

Mar. 29, 2002    (JP) .............................. 2002-095749

(51) Int. Cl.
*H05K 7/20*    (2006.01)
(52) U.S. Cl. ...................... 361/690; 361/688; 361/739; 361/625; 174/50.52; 123/41.31
(58) Field of Classification Search ................ 361/690, 361/704, 705, 692, 695, 707–712, 717–719; 257/706–727; 174/16.3, 52.3, 252, 59; 123/31, 123/41, 198 E; 180/8, 65; 165/80.3, 185, 165/46, 165; 307/10.1; 73/118.2
See application file for complete search history.

(56) References Cited

U.S. PATENT DOCUMENTS

| | | | | |
|---|---|---|---|---|
| 3,996,914 | A | * | 12/1976 | Crall et al. .............. 123/198 E |
| 4,006,724 | A | * | 2/1977 | Carter ..................... 123/198 E |
| 4,072,378 | A | * | 2/1978 | Lochbrunner et al. ...... 439/370 |
| 4,893,215 | A | * | 1/1990 | Urushiwara et al. ........ 361/739 |
| 5,207,186 | A | * | 5/1993 | Okita ...................... 123/41.31 |
| 5,208,728 | A | * | 5/1993 | Schirmer ..................... 361/752 |
| 5,243,131 | A | * | 9/1993 | Jakob et al. ................ 174/52.1 |
| 5,417,471 | A | * | 5/1995 | Kreis et al. ............ 296/203.02 |
| 5,481,433 | A | * | 1/1996 | Carter ......................... 361/690 |
| 5,671,802 | A | * | 9/1997 | Rogers ......................... 165/41 |
| 5,713,322 | A | * | 2/1998 | Mausner et al. ........ 123/184.21 |
| 5,789,704 | A | * | 8/1998 | Kawakita .................... 174/52.1 |
| 5,988,119 | A | * | 11/1999 | Trublowski et al. ...... 123/41.31 |
| 6,008,454 | A | * | 12/1999 | Kawakita .................... 174/52.1 |
| 6,273,181 | B1 | * | 8/2001 | Matsui et al. .................. 165/46 |
| 6,341,063 | B1 | * | 1/2002 | Kinoshita et al. ........... 361/690 |
| 6,552,441 | B1 | * | 4/2003 | Gander ......................... 307/9.1 |
| 6,573,616 | B1 | * | 6/2003 | Yamane ..................... 307/10.1 |
| 6,577,025 | B1 | * | 6/2003 | Hentschel et al. ......... 307/10.1 |
| 6,587,338 | B1 | * | 7/2003 | LaCroix et al. ............. 361/688 |
| 6,600,653 | B1 | * | 7/2003 | Koike et al. ................. 361/704 |
| 6,644,249 | B1 | * | 11/2003 | Itakura et al. ........... 123/41.31 |
| 6,648,399 | B1 | * | 11/2003 | Ozawa et al. ............... 296/208 |
| 6,788,534 | B1 | * | 9/2004 | Kinoshita et al. ........... 361/690 |

(Continued)

FOREIGN PATENT DOCUMENTS

EP    0 997 632 A1 *    5/2000

(Continued)

*Primary Examiner*—Michael Datskovskiy
(74) *Attorney, Agent, or Firm*—Posz Law Group, PLC (57) ABSTRACT

A housing for enclosing an electronic control unit is constructed of a resinous cover and a metallic case having heat conductivity higher than that of the resinous cover. An air intake module is mounted on an engine inside an engine compartment. The air intake module forms an air passage through which air flows from an air inlet toward the engine. The electronic control unit is mounted on the air intake module such that the metallic case is exposed to the air passage in the air intake module and the resinous cover is exposed to the outside of the air intake module, that is, exposed in the engine compartment.

15 Claims, 6 Drawing Sheets

U.S. PATENT DOCUMENTS

2002/0104490 A1 * 8/2002 Itakura et al. .......... 123/41.31

FOREIGN PATENT DOCUMENTS

| JP | U-4-784 | 1/1992 |
| JP | 406137146 A | * 5/1994 |
| JP | A-2002-134931 | 5/2002 |
| WO | WO 98/46458 | * 10/1998 |

* cited by examiner

HOUSING STRUCTURE OF ELECTRONIC CONTROL UNIT AND MOUNTING STRUCTURE OF THE SAME

CROSS REFERENCE TO RELATED APPLICATION

This application is based on Japanese Patent Application No. 2002-95749 filed on Mar. 29, 2002, the disclosure of which is incorporated herein by reference.

FIELD OF THE INVENTION

The present invention relates to a housing structure of an electronic control unit, which is for example installed in a vehicular engine compartment, and a mounting structure of the same.

BACKGROUND OF THE INVENTION

Generally, an electronic control unit, which performs a vehicle engine control, has a circuit board on which a microcomputer, an input-output circuit and a power circuit are printed. The circuit board is housed in a housing that is for example constructed of a case and a cover.

The electronic control unit includes electronic parts generating heat such as a driving element. If the temperature of the parts increases excessively, it causes problem to the operation. Further, the electronic control unit has been recently mounted inside of an engine compartment to shorten a vehicular harness.

To address the heating problems, the electronic control unit is for example encased in a special box having a fan for cooling. However, preparing the special box increases costs for manufacturing vehicles. Thus, it is difficult to cool the electronic control unit effectively at low costs.

Alternatively, the printed circuit board is installed in a space that is defined in an air cleaner separately from an intake air. However, this requires an additional housing to encase the printed circuit board because it is difficult to mount the printed circuit board directly on a mounting portion such as on a vehicle body. Also, it is difficult to change a mounting position of the printed circuit board while developing the vehicle.

SUMMARY OF THE INVENTION

The present invention is made in view of the above disadvantages, and it is an object of the present invention to provide a housing of an electronic control unit and a structure for mounting the electronic control unit with an improvement of cooling performance.

It is another object of the present invention to provide a housing of an electronic control unit and a structure for mounting the electronic control unit with arrangement flexibility.

According to the present invention, a housing for an electronic control unit includes a first member and a second member. The first member has heat conductivity greater than that of the second member. When the electronic control unit is mounted in an engine compartment, the housing is arranged such that the first member is adjacent to a part having heat radiation and the second member is adjacent to a part receiving heat in the engine compartment. For example, the electronic control unit having the housing can be mounted on a device such as an air intake module and a vehicle body.

Heat generated from electronic parts in the housing is radiated through the first member. Also, the second member interrupts heat conduction from the outside of the housing into the housing. Therefore, an increase in temperature of the electronic control unit is suppressed. Further, the mounting structure of the electronic control unit has flexibility against arrangement and design changes without an increase in manufacturing costs.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EMBODIMENTS

Embodiments of the present invention will be described hereinafter with reference to drawings.

[First Embodiment]

Figure 1:
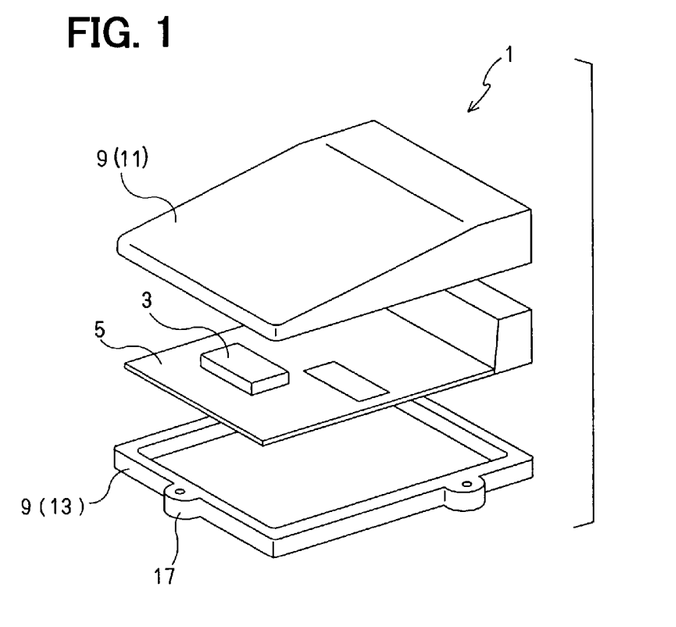
FIG. 1 is an exploded perspective view of an electronic control unit according to the first embodiment of the present invention.

As shown in FIG. 1, an ECU (electronic control unit) 1, which performs an engine control, has substantially a flat rectangular parallelepiped-shape. A housing 9 of the ECU 1 encloses a printed circuit board 5 on which various electronic parts (e.g. heating elements such as a driving element)

are mounted. The printed circuit board 5 connects with a connector 7, which will be described later.

The housing 9 has substantially a flat rectangular parallelepiped-shape and includes a cover 11 and a case 13. The cover 11 is in a flat box shape having an opening at one side (bottom side in FIG. 1). The case 13 is in a flat box shape having an opening at one side (top side in FIG. 1). The cover 11 is made of resin, such as polybutadiene-terephthalate, having low heat conductivity. The case 13 is made of metal, such as aluminum. The case 13 has heat conductivity higher than that of the cover 11. Also, the case 13 has fixing portions 17 to be fixed on an air intake module 15 shown in FIGS. 3A and 3B.

Figure 2A:
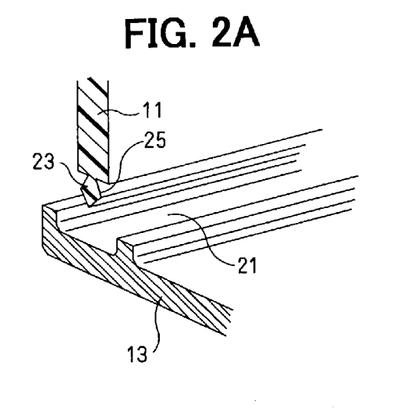
FIG. 2A is an exploded perspective view of joining portions of a case and a cover according to the first embodiment of the present invention.
Figure 2B:
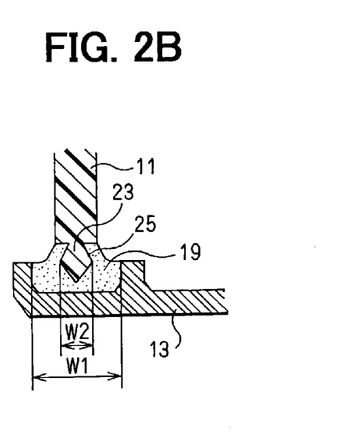
FIG. 2B is a cross-sectional view of the joining portions of the case and the cover according to the first embodiment of the present invention.

The resinous cover 11 and the metallic case 13 are joined to one another and bonded at the joining portions with an elastic adhesive 19, as shown in FIGS. 2A and 2B. The case 13 has a groove 21 at its outer periphery defining the opening and the cover 11 has a projection 23 at its outer periphery defining the opening to correspond to the groove 21. After the cover 11 is placed on the case 13 such that the projection 23 is in the groove 21, the elastic adhesive 19 is filled around the projection 23, thereby joining the cover 11 with the case 13. The elastic adhesive 19 has elasticity when it is dried after filling.

As shown in FIG. 2B, a dimension (width) W1 of the groove 21 is greater than a dimension (thickness) W2 of the projection 23. For example, the dimension W1 is twice or three as large as the dimension W2. Thus, the elastic adhesive 19 absorbs stress caused by thermal expansion difference between the cover 11 and the case 13.

The projection 23 has a wedge-shaped cross-section, as shown in FIG. 2B. The thickness of the projection 23 increases from the base toward the end and provides a hook portion 25. Thus, the hook portion 25 avoids separating the cover 11 from the case 13 due to wrench or tensile stress.

Next, a mounting structure of the ECU 1 will be described with reference to FIGS. 3A through 4B.

Figure 3A:
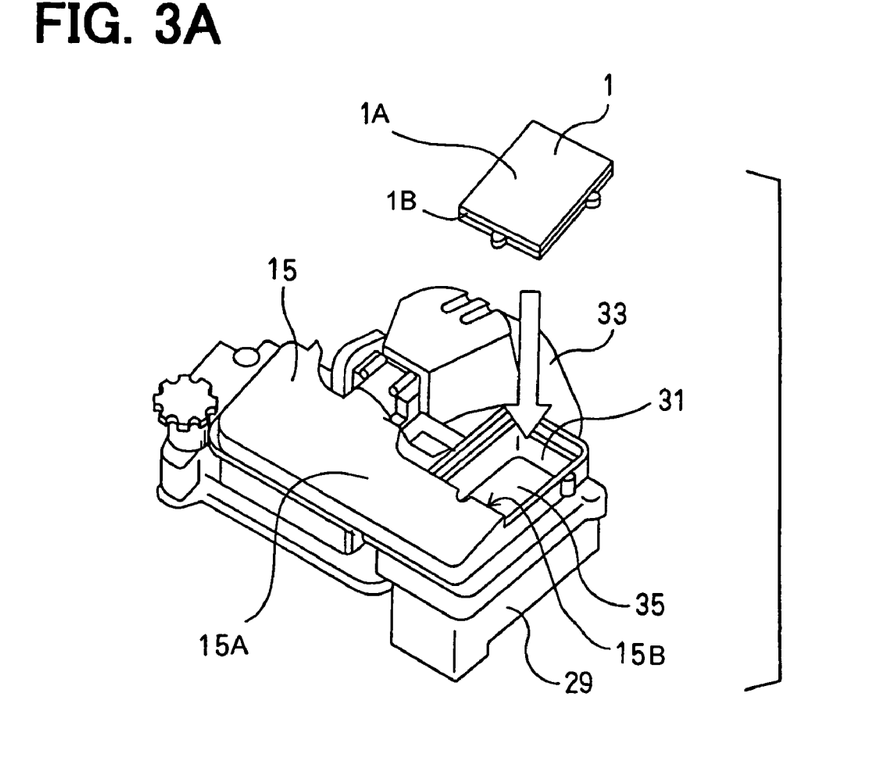
FIG. 3A is a perspective view of an air intake module and the electronic control unit to be mounted on the air intake module according to the first embodiment of the present invention.
Figure 3B:
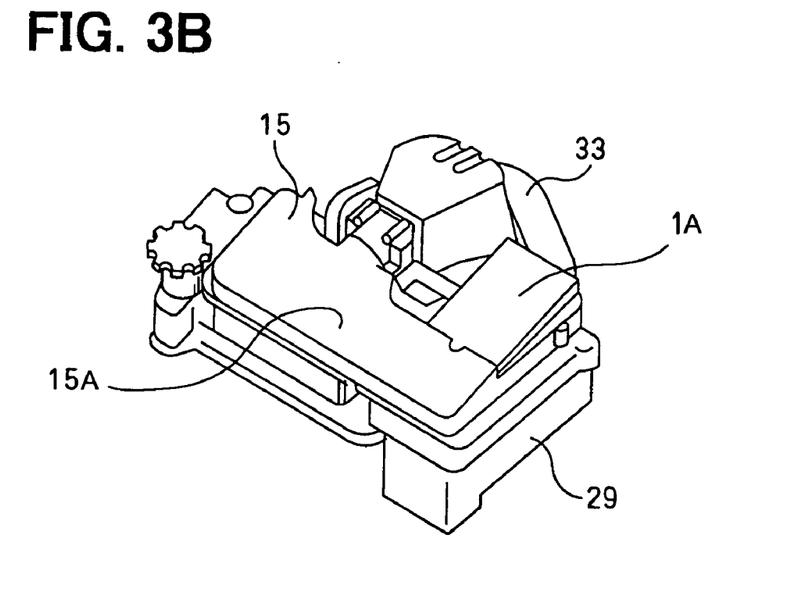
FIG. 3B is a perspective view of the air intake module and the electronic control unit mounted on the air intake module according to the first embodiment of the present invention.

An engine head cover 29 is provided on the top of an engine 27. The air intake module 15 is mounted on the engine head cover 29 in an engine compartment 37. The air intake module 15 houses an air cleaner 31 and connects with an intake manifold 33. Here, the air intake module 15 is a device for introducing air from the outside toward the engine 27.

The air intake module 15 has an opening 35 above the air cleaner 31, as shown in FIG. 3A. The ECU 1 is installed in the opening 35, as shown in FIG. 3B. The air intake module 15 forms an air passage 41 therein. The air sucked from an air inlet 39 is introduced toward the engine 27 through the air passage 41.

Figure 4A:
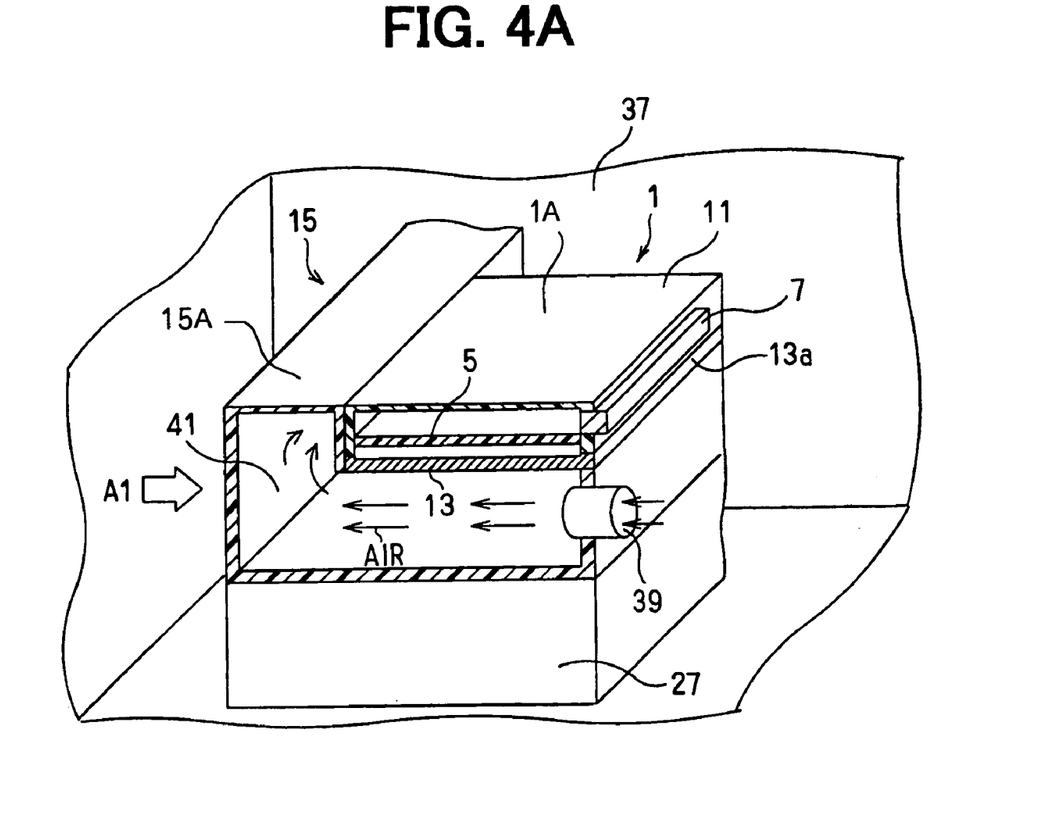
FIG. 4A is an explanatory diagram of the electronic control unit mounted on the air intake module according to the first embodiment of the present invention.
Figure 4B:
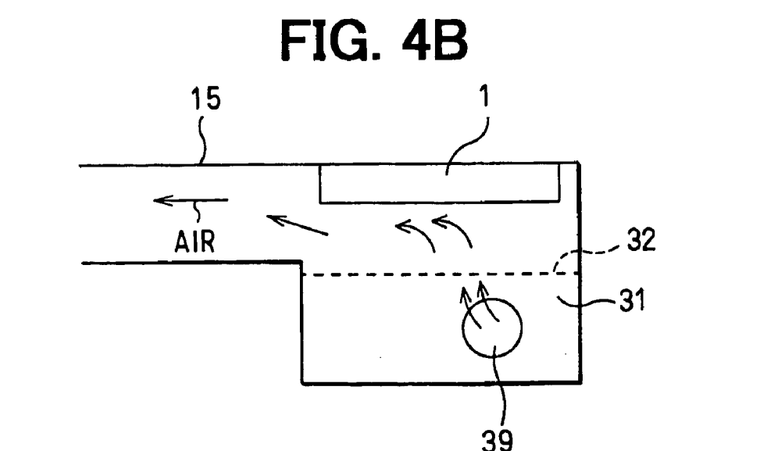
FIG. 4B is an explanatory diagram of the electronic control unit viewed along an arrow A1 in FIG. 4A.

The ECU 1 is mounted to face the air passage 41, as shown in FIG. 4B. Specifically, the metallic case 13 is exposed to the air passage 41 and the resinous cover 11 is exposed to the outside of the air intake module 15. That is, the resinous cover 11 is exposed to surroundings inside the engine compartment 37. Also, the connector 7 and the end 13a of the case 13 are exposed to the outside of the air intake module 15.

As shown in Figs 3A and 3B, the ECU 1 is installed in a recessed portion of the air intake module 15. As shown best in FIG. 4A, an outer wall 1A of the housing of the ECU 1 is continuous with an outer wall 15A of the air intake module 15. Further, as shown in Figs 3A and 3B, an end wall 1B of the ECU 1 contacts and faces a side wall 15B of the air intake module 15.

As shown in FIG. 4B, a filter 32 is provided in the air passage 41 between the air inlet 39 and the ECU 1 when the air intake module 15 is viewed along an arrow A1 in FIG. 4A. Because FIG. 4A is a schematic illustration, the air cleaner 31 is not illustrated in FIG. 4A.

The ECU 1 is installed in the opening 35 of the air intake module 15 adjacent to the air cleaner 31. The ECU 1 is arranged such that the cover 11 is exposed to the outside of the air intake module 15 and the case 13 is exposed to the air passage 41 in the inside of the air intake module 15. Therefore, heat generated in the ECU 1 is radiated to the air passing in the air passage 41, through the metallic case 13 having high heat conductivity. On the other hand, the resinous cover 11, which has low heat conductivity, interrupts heat in the engine compartment 37 to pass into the housing 9. Therefore, the cover 11 suppresses an increase in temperature of the ECU 1.

Further, the case 13 is not in direct contact with the engine 27. The air passage 41 (air layer) is defined between the case 13 and the engine 27. Therefore, heat conduction from the engine 27 to the ECU 1 is suppressed.

Accordingly, the mounting structure suppresses the temperature increase of the ECU 1 (electronic parts 3 in the housing 9). Further, the mounting structure makes design changes easy without an increase in a manufacturing cost.

Figure 9:
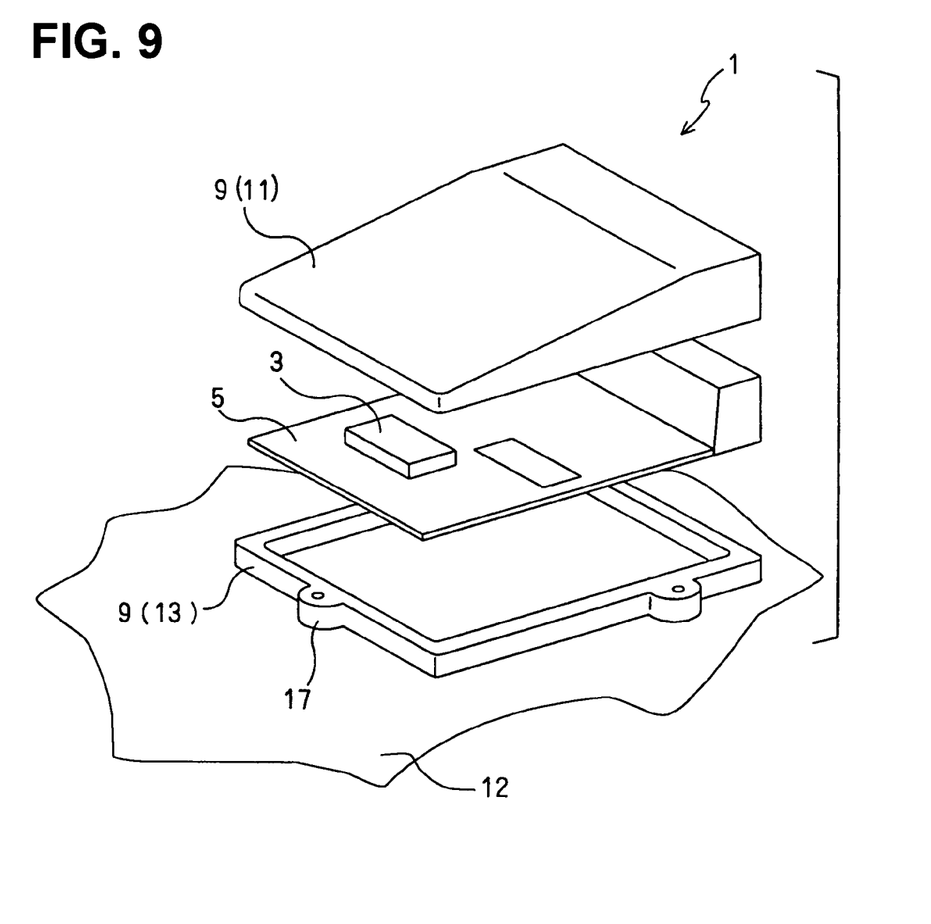
FIG. 9 is a partial, diagrammatic, exploded perspective view of an electronic control unit according to a modification of the first embodiment.

The mounting position of the ECU 1 having the housing 9 is not limited to the air intake module 15. The ECU 1 can be mounted on any other part, for example, on a vehicle body 12, as shown in FIG. 9. In a case that the ECU 1 is mounted on the vehicle body 12, the case 13, which has high heat conductivity, is directly in contact with the vehicle body 12 or is attached to the vehicle body 12 through a heat conductive member. Also, the cover 11 is arranged adjacent to a portion that easily receives radiation heat from surroundings such as the engine. Thus, the heat generated in the ECU 1 is radiated to the vehicle body 12. Also, the cover 11 suppresses the heat conduction from the engine into the ECU 1.

[Second Embodiment]

Figure 5:
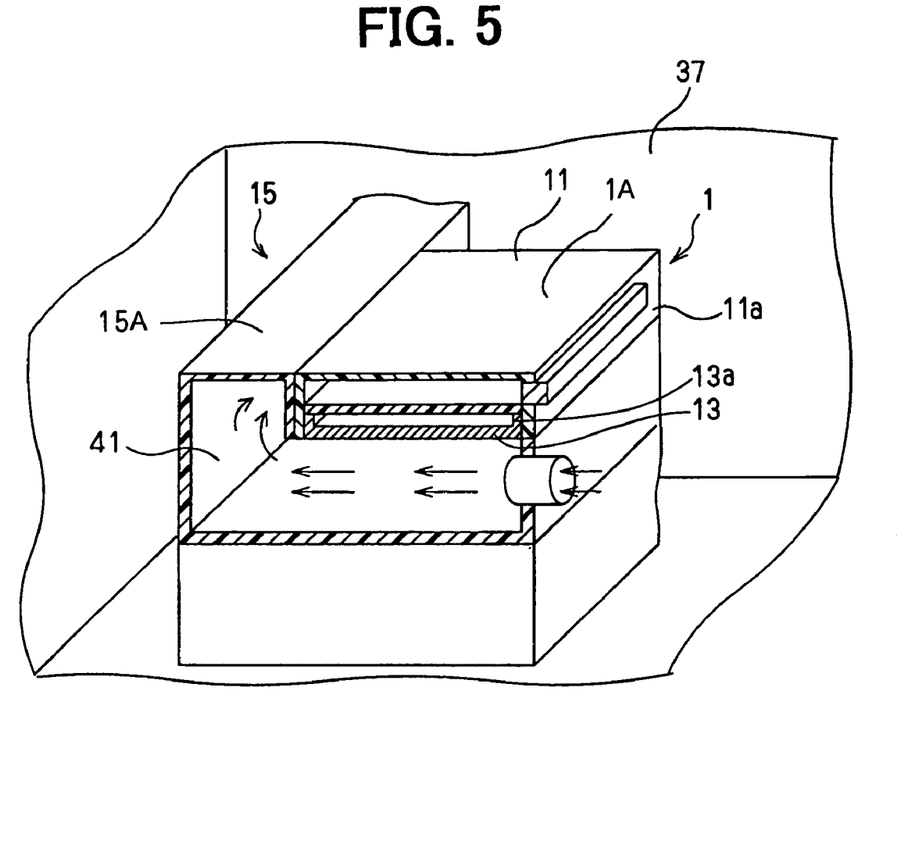
FIG. 5 is an explanatory diagram of an electronic control unit mounted on an air intake module according to the second embodiment of the present invention.

As shown in FIG. 5, the ECU 1 is mounted on the air intake module 15 in a manner similar to the first embodiment. The case 13 is exposed to the air passage 41 in the air intake module 15 and the cover 11 is exposed to the outside of the air intake module 15. However, an end 13a of the case is not exposed to the outside the air intake module 15, but is covered with a side wall 11a of the cover 11.

Also in the second embodiment, the ECU 1 provides advantages similar to those of the first embodiment. In addition, since the end 13a of the case 13 is not exposed in the engine compartment 37, heat conduction from the engine compartment 37 into the ECU 1 is further suppressed.

[Third Embodiment]

Figure 6:
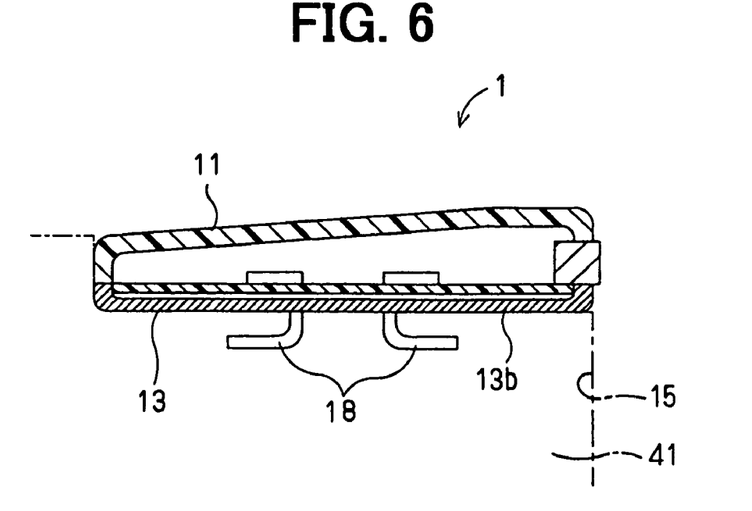
FIG. 6 is a schematic cross-sectional view of an electronic control unit mounted on an air intake module according to the third embodiment of the present invention.

As shown in FIG. 6, the ECU 1 is mounted on the air intake module 15 in a manner similar to the first embodiment. The case 13 is exposed to the air passage 41 in the air intake module 15 and the cover 11 is exposed to the outside of the air intake module 15. In addition, a pair of legs 18 is provided to the bottom 13b of the case 13 to protrude from the housing 9. The legs 18 are fixed to the housing 9 by welding or with screws. The legs 18 are made of metal having high heat conductivity similar to the case 13.

In addition to the advantages similar to those of the first embodiment, since the metallic legs 18 are exposed to the air passage 41, heat generated in the ECU 1 is radiated to the air through the legs 83. Therefore, it improves heat radiation efficiency of the ECU 1. Further, the legs 18 can be used to fix the ECU 1 to the vehicle body, thereby improving mounting versatility.

[Fourth Embodiment]

Figure 7A:
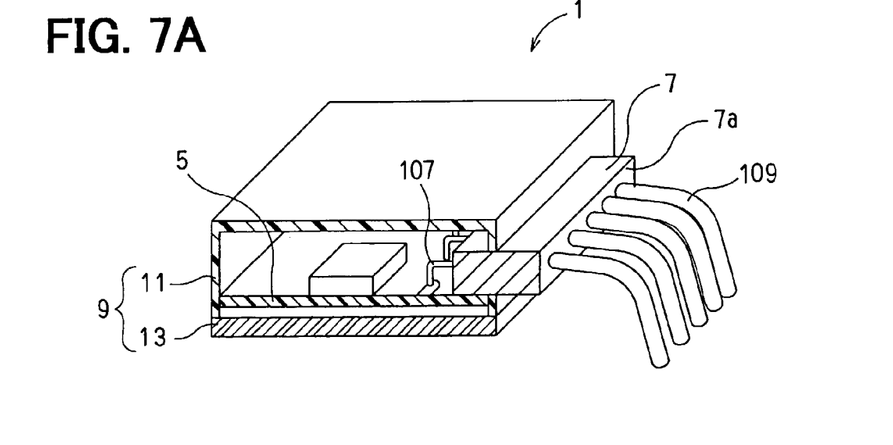
FIG. 7A is a perspective view of an electronic control unit, partially includes cross-section, according to the fourth embodiment of the present invention.

As shown in FIG. 7A, the connector 7 electrically and thermally connects with the printed circuit board 5 through wires 107. Also, the connector 7 electrically and thermally connects with connector cables 109. The ECU 1 is mounted on the air intake module 15 such that the case 13 is exposed to the air passage 41 inside the air intake module 15 and the cover 11 is exposed to the outside of the air intake module 15.

Figure 7B:
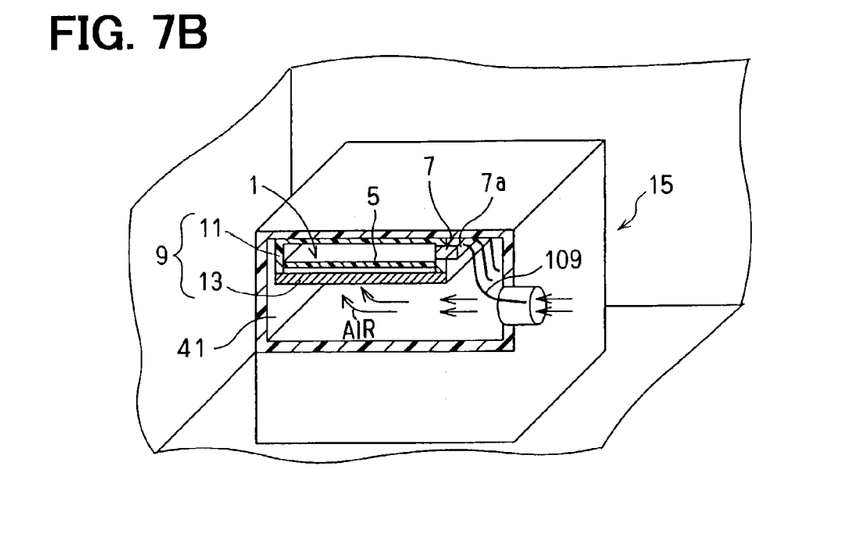
FIG. 7B is an explanatory diagram of the electronic control unit mounted on the air intake module according to the fourth embodiment of the present invention.

The connector cables 109 and an end 7a of the connector 7 are exposed to the air passage 41 inside the air intake module 15, as shown in FIG. 7B. Therefore, the advantages similar to the first embodiment are provided. In addition, since the end 7a of the connector 7 and the connector cable 109 are exposed to the air passage 41, heat radiation from the ECU 1 is improved.

Alternatively, the ECU 1 can be mounted such that the cover 11 is attached to the inner wall of the air intake module 15, as shown in FIG. 7B. Since the case 13 is exposed to the air passage 41, heat radiation through the case 13 is maintained. Further, since the cover 11 is not exposed to the engine compartment 37, the heat conduction from the engine compartment 37 into the ECU 1 is further suppressed.

Figure 8:
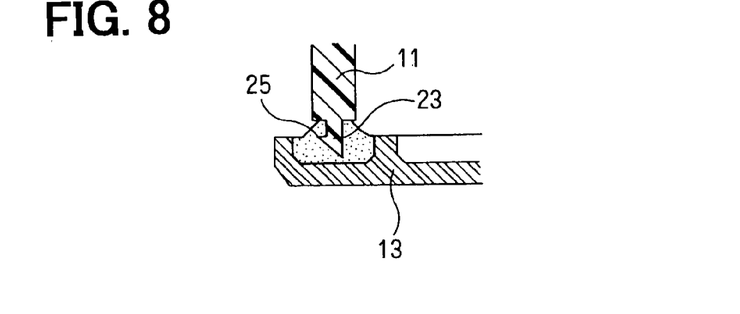
FIG. 8 is a cross-sectional view of joining portions of a case and a cover according to another modified embodiment of the present invention.

As another modification, the projection 23 of the cover 11 can have any other shapes. For example, as shown in FIG. 8, the projection 23 can have an arrow-shaped cross-section including the hook portion 25. Therefore, it restricts separation of the cover 11 and the case 13.

Although the housing 9 is constructed of the cover 11 and the case 13, it can be constructed in combination with another member. The case 11 and the cover 13 can have the same size.

The present invention should not be limited to the disclosed embodiments, but may be implemented in other ways without departing from the spirit of the invention.

What is claimed is:

1. A housing for an electronic control unit mounted inside a vehicle engine compartment, the housing comprising:
   a first member having heat conductivity; and
   a second member having heat conductivity lower than that of the first member, wherein:
      the first member is made of metal and the second member is made of resin,
      the first member is arranged adjacent to a part that readily transfers heat away from the first member, and the second member is arranged adjacent to a part that radiates heat in the engine compartment,
      the first member includes a groove and the second member has a projection, and the projection and the groove are joined with an elastic adhesive,
      the projection includes a hook portion to restrict separation of the first member and the second member, and
      a dimensional allowance is defined between the projection and groove.

2. The housing according to claim 1, wherein the first member is mounted to a device defining an air passage therein.

3. The housing according to claim 2, wherein the device is a module for introducing intake air to the air passage.

4. The housing according to claim 2, wherein the device includes an air cleaner through which air flows.

5. The housing according to claim 2, wherein the first member is arranged adjacent to the air passage.

6. The housing according to claim 2, wherein the air passage is located between the first member and an engine.

7. The housing according to claim 2, wherein the first member is arranged without exposing to the outside of the device.

8. The housing according to claim 2, wherein the first member includes a leg portion that protrudes from the first member to the air passage.

9. The housing according to claim 2, wherein the first member includes a connector and a connector cable for the electronic control unit, and the first member is mounted such tat at least one of the connector and the connector cable is adjacent to the air passage.

10. An electronic control unit mounted on a casing of an air intake module in an engine compartment comprising:
   a housing formed of a resin cover and a metal case, the metal case having one of a square-shape and a rectangular-shape;
   an electronic circuit board housed in said housing; and
   an electronic component disposed on said electronic circuit board that generates heat when activated; wherein
   the casing of said air intake module has an air passage therein through which air flows toward the vehicle engine and an opening which partially opens the air passage,
   the opening has a shape corresponding to the shape of the metal case,
   said housing is mounted on said opening of said casing in a manner such that said metal case covers said opening to close said opening and form said air passage,
   the casing of the air intake module has a first wall forming the air passage therein, the first wall further forms a recessed portion partially depressed from the first wall, and the opening is formed in the recessed portion, and
   the housing is installed in the recessed portion such that the metal case closes the opening.

11. The electronic control unit of claim 10, wherein said opening of said air intake module is formed at an inlet portion thereof.

12. The housing according to claim 1, wherein:
   the electronic control unit further includes an electronic circuit board, which is housed in the housing, and an electronic component, which is disposed on the electronic circuit board,
   the electronic component generates heat when activated,
   the housing is mounted to an air intake module, which introduces air into the vehicle engine,
   the air intake module includes an air passage therein through which air flows and an opening, which partially opens the air passage,
   the housing is mounted on the opening of the air intake module in a manner such that said metal case covers said opening to close said opening and form said air passage.

13. The electronic control unit according to claim 10, wherein
   the housing is installed in the recessed portion such that a wall of the housing which is opposed to the metal case forms a continuous surface with the first wall of the casing.

14. The electronic control unit according to claim 10, wherein
   the casing has a second wall that is perpendicular to the first wall and farms the recessed portion, and
   the housing contacts with the second wall of the casing at a side wall thereof.

15. The electronic control unit according to claim 10 wherein
   the casing of the air intake module has a air inlet portion through which air is introduced into the air passage, and
   the housing is arranged such that the metal case is substantially parallel to an axis of the air inlet portion at a position close to the air inlet portion.

* * * * *